United States Patent
Cengarle et al.

(10) Patent No.: US 11,430,463 B2
(45) Date of Patent: Aug. 30, 2022

(54) DYNAMIC EQ

(71) Applicants: DOLBY INTERNATIONAL AB, Amsterdam Zuidoost (NL); DOLBY LABORATORIES LICENSING CORPORATION, San Francisco, CA (US)

(72) Inventors: Giulio Cengarle, Barcelona (ES); Antonio Mateos Sole, Barcelona (ES); Dirk Jeroen Breebaart, Ultimo (AU)

(73) Assignees: DOLBY LABORATORIES LICENSING CORPORATION, San Francisco, CA (US); DOLBY INTERNATIONAL AB, Amsterdam (NL)

( * ) Notice: Subject to any disclaimer, the term of this patent is extended or adjusted under 35 U.S.C. 154(b) by 0 days.

(21) Appl. No.: 17/259,787

(22) PCT Filed: Jul. 11, 2019

(86) PCT No.: PCT/US2019/041457
§ 371 (c)(1),
(2) Date: Jan. 12, 2021

(87) PCT Pub. No.: WO2020/014517
PCT Pub. Date: Jan. 16, 2020

(65) Prior Publication Data
US 2021/0312937 A1    Oct. 7, 2021

Related U.S. Application Data

(60) Provisional application No. 62/730,780, filed on Sep. 13, 2018.

(30) Foreign Application Priority Data

Jul. 12, 2018 (ES) .............................. ES201830698
Sep. 25, 2018 (EP) .................................... 18196532

(51) Int. Cl.
*G10L 21/034* (2013.01)
*G10L 21/028* (2013.01)
(Continued)

(52) U.S. Cl.
CPC .......... *G10L 21/034* (2013.01); *G10L 21/028* (2013.01); *G10L 25/18* (2013.01); *G10L 25/51* (2013.01)

(58) Field of Classification Search
CPC ..... G10L 21/034; G10L 21/028; G10L 25/18; G10L 25/51; G10L 19/24; G10L 19/008;
(Continued)

(56) References Cited

U.S. PATENT DOCUMENTS 7,587,254 B2 * 9/2009 Kirkeby ............ H04L 25/03159
704/502
7,848,531 B1 * 12/2010 Vickers .................. H03G 7/002
381/107
(Continued)

FOREIGN PATENT DOCUMENTS

EP            1843635 A1 * 10/2007 ............. H04S 7/301
WO  WO-2005101959 A2 * 11/2005 ............. G10L 21/02
(Continued)

OTHER PUBLICATIONS

Florian Hilger and Hermann, Quantile Based equalization for Noise Robust Speech Recognition (Year: 2001).*
(Continued)

*Primary Examiner* — Akelaw Teshale

(57) ABSTRACT

Various embodiments are disclosed for (possibly simultaneously) applying EQ and DRC to audio signals. In an embodiment, a method comprises: dividing an input audio signal into n frames, where n is a positive integer greater than one; dividing each frame of the input audio signal into Nb frequency bands, where Nb is a positive integer greater
(Continued)

than one; for each frame n: computing an input level of the input audio signal in each band f, resulting in a input audio level distribution for the input audio signal; computing a gain for each band f based at least in part on a mapping of one or more properties of the input audio level distribution to a reference N audio level distribution computed from one or more reference audio signals; and applying each computed gain for each band f to each corresponding band f of the input audio signal.

20 Claims, 6 Drawing Sheets

(51) Int. Cl.
*G10L 25/18* (2013.01)
*G10L 25/51* (2013.01)

(58) Field of Classification Search
CPC ..... G10L 25/21; G10L 19/032; G10L 19/002; G10L 19/09; G10L 19/06; G10L 25/03; G10L 25/78; G10L 21/038; G10L 19/005; G10L 21/0208; G10L 25/84; G10L 21/0272; G10L 19/0208; G10L 19/083; G10L 21/0232; G10L 21/0388; G10L 25/93; G10L 15/20; G10L 19/02; G10L 19/12; G10L 25/06; G10L 25/12; G10L 25/54; G10L 15/02; G10L 19/00; G10L 2021/02082; G10L 2021/02087; G10L 2021/02166; G10L 21/0224; G10L 21/0324; G10L 25/30; G10L 15/16; G10L 19/04; G10L 2021/02165; G10L 21/0216; G10L 21/0364; G10L 25/48; G10L 19/018; G10L 19/035; G10L 19/038; G10L 19/18; G10L 19/20; G10L 19/265; G10L 2015/088; G10L 2015/223; G10L 21/003; G10L 21/06; G10L 25/60; G10L 19/0017; G10L 19/012; G10L 19/0212; G10L 19/022; G10L 19/10; G10L 19/22; G10L 2025/783; G10L 2025/786; G10L 21/04; H04R 3/04; H04R 2430/01; H03G 3/32; H03G 5/025; H03G 5/165; H03G 9/005; H03G 9/025
See application file for complete search history.

(56) References Cited

U.S. PATENT DOCUMENTS

| | | | |
|---|---|---|---|
| 8,160,282 B2* | 4/2012 | Christoph | H04S 7/301 381/310 |
| 8,315,862 B2* | 11/2012 | Kim | G10L 21/0364 704/214 |
| 8,929,567 B2* | 1/2015 | Crockett | G10L 21/0364 381/98 |
| 9,053,697 B2* | 6/2015 | Park | G10K 11/17854 |
| 9,696,962 B1* | 7/2017 | Yonovitz | H03G 5/025 |
| 2003/0115041 A1* | 6/2003 | Chen | G10L 19/02 704/E19.01 |
| 2009/0306971 A1* | 12/2009 | Kim | G10L 21/0364 704/203 |
| 2011/0173011 A1* | 7/2011 | Geiger | G10L 19/0212 704/500 |
| 2011/0293103 A1* | 12/2011 | Park | G10K 11/17823 381/57 |
| 2012/0243715 A1* | 9/2012 | Pedersen | H04R 25/505 381/98 |
| 2014/0173519 A1* | 6/2014 | Sassi | G06F 3/0487 715/833 |
| 2014/0177868 A1* | 6/2014 | Jensen | H04R 3/002 381/94.7 |
| 2014/0371889 A1 | 12/2014 | Donaldson | |
| 2015/0149157 A1* | 5/2015 | Atti | G10L 19/0204 704/205 |
| 2016/0055855 A1* | 2/2016 | Kjoerling | G10L 19/04 704/500 |
| 2016/0111095 A1* | 4/2016 | Schnabel | G10L 19/07 704/501 |
| 2016/0373197 A1 | 12/2016 | Brenner | |
| 2017/0103764 A1* | 4/2017 | Wang | G10L 19/083 |
| 2017/0201219 A1* | 7/2017 | Baumgarte | G10L 19/008 |
| 2017/0230024 A1* | 8/2017 | Lu | G10H 1/46 |
| 2017/0311107 A1 | 10/2017 | Ward | |
| 2018/0012610 A1* | 1/2018 | Riedmiller | G10L 19/018 |

FOREIGN PATENT DOCUMENTS

| | | | | |
|---|---|---|---|---|
| WO | WO-2010138311 A1 * | 12/2010 | | G10L 21/0205 |
| WO | WO-2014160548 A1 * | 10/2014 | | G10H 1/12 |
| WO | 2015035492 A1 | 3/2015 | | |
| WO | WO-2015038522 A1 * | 3/2015 | | G10L 19/008 |

OTHER PUBLICATIONS

Cunningham, Wayne "Dynamic EQ Automatically Adjusts Bass and Treble for Optimal Audio" CNET, Jan. 3, 2016.

Hilger, F. et al "Quantile Based Histogram Equalization for Noise Robust Speech Recognition" Eurospeech, vol. 2, Sep. 3, 2001, pp. 1135-1138.

Perez-Gonzalez, E et al. "Automatic Equalization of Multi-Channel Audio Using Cross-Adaptive Methods" presented at the 127th Convention, Oct. 9-12, 2009, New York, USA, pp. 1-6.

Valimaki, V. et al. "All About Audio Equalization: Solutions and Frontiers" Applied Sciences, published May 6, 2016, pp. 1-46.

* cited by examiner

DYNAMIC EQ

CROSS-REFERENCE TO RELATED APPLICATIONS

This application claims the benefit of priority to Spanish Patent Application No. P201830698 filed on 12 Jul. 2018; U.S. Provisional Patent Application No. 62/730,780 filed on 13 Sep. 2018; and European Patent Application No. 18196532.8, filed on 25 Sep. 2018, which are hereby incorporated by reference.

TECHNICAL FIELD

This disclosure relates generally to audio signal processing, and more particularly to applying equalization and dynamic compression to audio signals.

BACKGROUND

Amateur audio recordings often contain several unwanted features not present in professional recordings, such as dips and resonances due to room modes, microphone-related frequency response anomalies, uncontrolled dynamic range, distortion, wildly varying digital levels in the signals recorded by different devices, etc. These low-quality recordings can be improved during recording and mixing by using equalization (EQ) and dynamic range compression (DRC). One of the uses of EQ and DRC is to tame inherent defects in the signal chain (e.g., microphone positioning, strong room resonances, etc.) and help the user produce a more balanced recording that has clarity and depth.

SUMMARY

Various embodiments are disclosed for (possibly simultaneously) applying EQ and DRC (hereinafter "DynEQ") to audio signals (e.g., songs). DynEQ builds and exploits spectral profiles (hereinafter "target profiles") by analyzing reference material, such as well-mastered music tracks. The target profiles include statistics about the dynamics of each frequency band of the signal (e.g., in the form of quantile curves) rather than a single average target EQ curve. Signal processing is applied to the audio signal to match the spectral profile of the audio signal to a target spectral profile in a way that depends on the dynamic statistics. For example, the signal processing includes applying time-varying, frequency dependent gains to the original audio signal, which have a joint effect of a time-varying equalizer and a time-varying leveler.

In an embodiment, this allows DynEQ to be used in an "offline" mode, where the audio signal is analyzed in a first-pass before the signal processing is applied. The first-pass allows DynEQ to obtain accurate statistics for the audio signal that can be used to improve the quality of the audio signal. The accurate statistics allow DynEQ to avoid matching parts of the audio signal to a target spectral profile when the parts should be handled differently. For example, in "offline" mode an entire song can be analyzed to understand where the soft (e.g., the intro) or loud parts (e.g., the chorus) are located, which allows the soft and loud parts of the song to be equalized using different quantile curves of the same target profile. In an embodiment, DynEQ can also be used in an "online" mode, where the dynamic statistics are obtained from the audio signal while the audio signal is being played back to a listener on an audio playback device.

In an embodiment, DynEQ can use an estimate of stationary background noise in the audio signal to avoid boosting time-frequency tiles of the audio signal with low signal-to-noise ratios (SNRs). In an embodiment, DynEQ incorporates a normalization step that makes the DynEQ processing independent from the overall digital level of the audio signal, which is often unpredictable.

In an embodiment, a method comprises: dividing an input audio signal into n frames, where n is a positive integer greater than one; dividing each frame of the input audio signal into Nb frequency bands, where Nb is a positive integer greater than one; for each frame n: computing an input level of the input audio signal in each band f, resulting in a input audio level distribution for the input audio signal; computing a gain for each band f based at least in part on a mapping of one or more properties of the input audio level distribution to a reference audio level distribution computed from one or more reference audio signals; and applying each computed gain for each band f to each corresponding band f of the input audio signal.

Other embodiments include a system, apparatus and non-transitory, computer-readable medium.

The details of one or more implementations of the subject matter are set forth in the accompanying drawings and the description below. Other features, aspects and advantages of the subject matter will become apparent from the description, the drawings and the claims.

DETAILED DESCRIPTION

Example System

Figure 1:
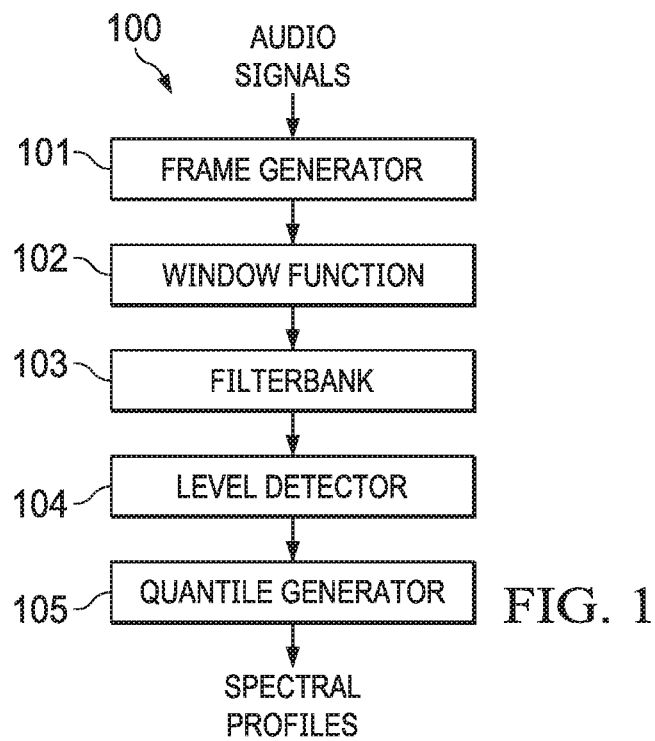
FIG. 1 is a block diagram of an audio processing system for building spectral profiles of audio signals, according to an embodiment.

FIG. 1 is a block diagram of an audio processing system 100 for building spectral profiles of audio signals, according to an embodiment. System 100 includes frame generator 101, window function 102, filterbank 103, level detector 104 and quantile generator 105.

A spectral profile of an input audio signal is the statistical distribution of its level per frequency band computed across audio frames. Frame generator 101 divides an input audio signal s(t) into frames of length frameLength samples (e.g., 4096 samples) with nOverlap samples (e.g., 2048 samples) of overlap between consecutive frames. Hereinafter, the input audio signal at frame n is referred to as s(n). Window function 102 (e.g., a fade-in, fade-out window) is applied to each frame n, to ensure smooth interpolation between consecutive frames. In an embodiment, a Hanning window is used.

Filterbank 103 divides the windowed signal s(t) into Nb frequency bands (e.g., 83 bands or sub-bands). We refer to the signal in band f at frame n as s(n,f). Level detector 104 computes level $L_{in}(n,f)$ of the input audio signal in each band f at each frame n. E(n,f) is the energy of the input audio signal in the band at the given frame n. The level is the energy converted to dB:

$$L_{in}(n,f)=10 \cdot \log 10(E(n,f)).$$

In an embodiment, when computing the energy of a new frame in each band, the result can be smoothed over time by using, e.g., a first order low-pass filter described by:

$$eSmooth(n,f)=eSmooth(n-1,f) \cdot \alpha + E(n,f) \cdot (1-\alpha),$$

where the coefficient α can be chosen among attack or release coefficients derived from different attack/release time constants, depending on whether the energy at the current frame is respectively larger or smaller than the smooth value at the previous frame.

Figure 2:
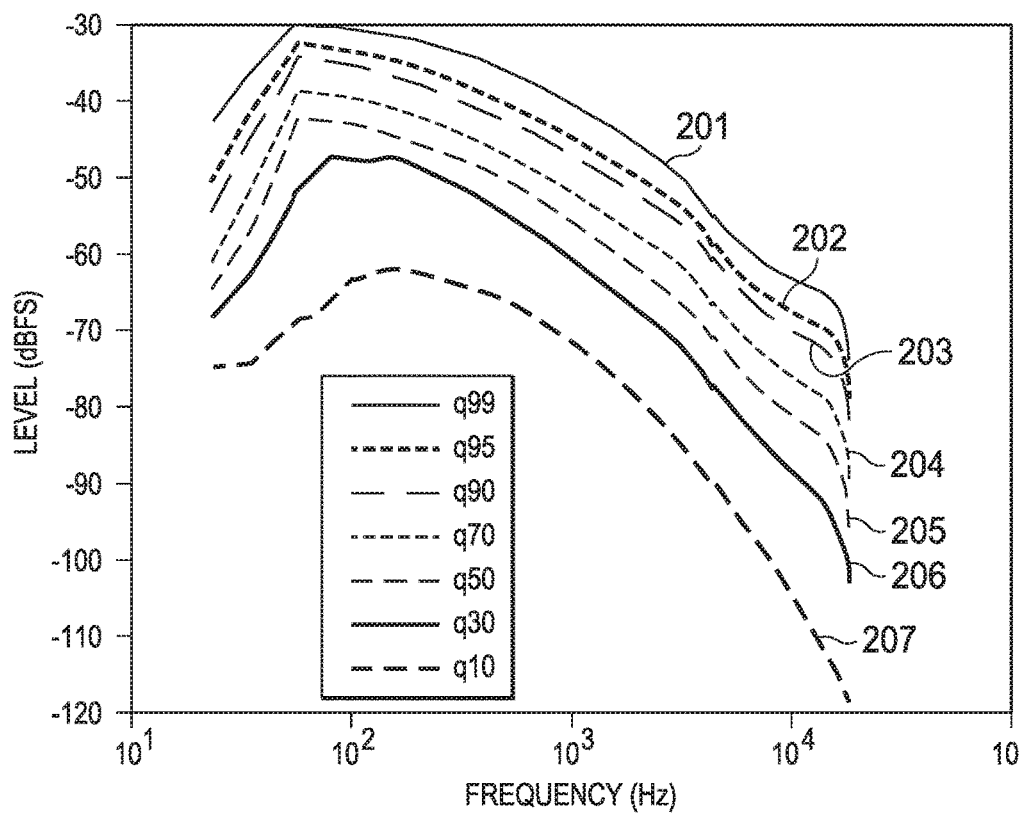
FIG. 2 is a plot illustrating quantile curves corresponding to a spectral profile, according to an embodiment.

FIG. 2 is an example of quantile curves corresponding to a spectral profile produced by system 100. The vertical axis is level (dBFS) and the horizontal axis is frequency (Hz). In each band f, the x-th quantile $q_x(f)$ of the level distribution is computed as the value below which x % of the levels across frames in the band are contained. In this example, the spectral profile includes 7 quantiles 207-201 ($q_{10}$, $q_{30}$, $q_{50}$, $q_{70}$, $q_{90}$, $q_{95}$, $q_{99}$) for each band. If the signal is multichannel, the level in each band at a given frame n can be computed, e.g., as the root-mean-square (RMS) average of energies across channels:

$$E(n)=\sqrt{(E^2(n,ch_1)+\ldots+E^2(n,ch_N))}.$$

Other choices, such as taking the maximum across channels, lead to similar results in generic cases, but may be preferable in specific domains (e.g., applying to a 5.1 track).

A. Building Profiles (Training)

In the training stage, a target profile is generated using system 100. The target profile is the spectral profile of a reference song or track or a collection of reference songs/tracks. Target profiles can also be built for vocal or instrument tracks, e.g., by using collections of male vocalist recordings, bass recordings, etc. The terms "song" or "track" is used generically to refer to each of the excerpts of a collection. If the target profile is generated from more than one song/track, the songs/tracks are normalized before computing the profile so that they have the same loudness. In an embodiment, loudness is computed as specified by the standard European Broadcasting Union Recommendation (EBU) R128. After normalization, the statistics are built by analyzing the aggregate frames of all songs/tracks (as if all the songs/tracks had been concatenated into a single one).

Multiple target profiles, such as targets corresponding to different musical genres, instrument tracks (e.g., vocals, bass, drums, etc.), cinematic stems (e.g., dialogue, effects, music, etc.), can be generated by system 100 and stored for DynEQ processing as described in reference to FIG. 3. In some applications, a variety of target profiles may be provided within one and the same group to allow for user selection and variation of the resulting output effect. For example, different vocal target profiles may be provided that represent different vocal mixing styles or techniques as used by content creators. As such the end-user of the application can select which target (or reference) profile is used to allow for creative decisions within the processing step.

B. Processing Audio Signals

Figure 3A:
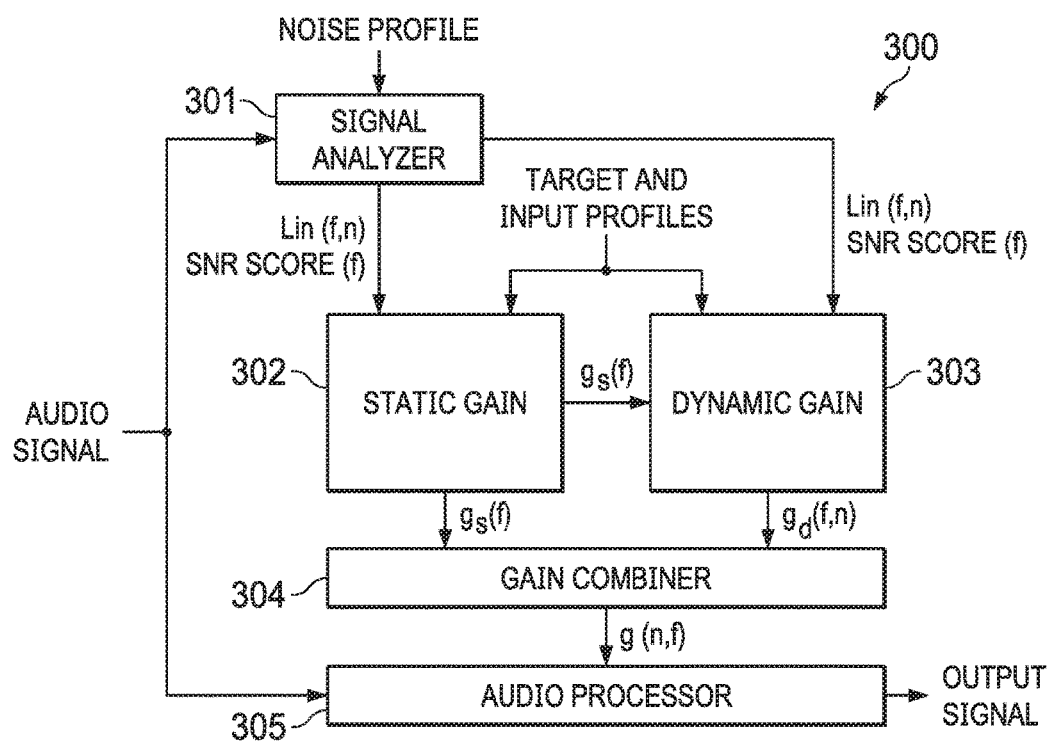
FIG. 3A is block diagram of an audio processing system for applying DynEQ to audio signals in an offline workflow, according to an embodiment.

FIG. 3A is a block diagram of an audio processing system 300 for applying DynEQ to audio signals in an offline workflow, according to an embodiment. Given a target profile and an input audio signal, the goal is to process the input audio signal so that its spectral profile (hereinafter called the "input profile") matches the target profile. This operation includes computing and applying a gain g (f,n) in each frame n, for each frequency band f.

In the embodiment shown, signal analyzer 301 analyzes the input audio signal and background noise to build the input profile and a noise profile. In an offline mode, this computation is done as described in reference to FIG. 1. In an online mode, the input profile is built as the song/track is playing. The online mode may lead to some inaccuracy at the beginning of a song/track but would converge to the offline version by the end of the song/track. In such cases, computing the gains per band can include additional conditions to minimize potential undesirable effects of lack of information about the whole song/track during the initial frames.

When an estimate of the background noise profile is available (e.g., when a fragment containing only noise is available and its profile is computed), signal analyzer 301 builds an internal estimate of the SNR for each time-frequency tile SNR (f,n). If a background noise estimate is not available, this step can be by-passed by setting all SNRs to a very large value (equivalent to assuming very low background noise) or to a value set by trial-and-error. Signal analyzer 301 also computes an SNR score in each band, SNRscore(f) being a real number in [0.0, 1.0] that represents how much a quantile is close to the quantiles of the noise profile. A value of 0.0 indicates bad SNR (e.g., SNR<0.0), a value of 1.0 indicates good SNR (e.g. SNR>12.0), and values in-between are mapped to SNRscore(f) by linear interpolation.

In an embodiment, SNRscore (f) is computed by applying a function F to SNR (f,n), where F maps a range of real values [−inf,+inf] to [0.0, 1.0]. An example of such function F is:

F(SNR)=0.0 if SNR<0.0;
F(SNR)=1.0 if SNR>12.0; and
F(SNR)=SNR/12.0 if 0.0<SNR<12.0; (linear interpolation)

Other functions that map [−inf, +inf] to [0.0, 1.0] can be used, such as Sigmoid functions.

Static gain generator 302 computes the static gains $g_s(f)$. First, the target profile is displaced so that it has the same loudness as the input profile. In an embodiment, loudness is computed by averaging over all bands the values of a given quantile (e.g. $q_{90}$). This step ensures that the algorithm operates independently from the input overall digital level.

So all target quantiles are shifted: $Q_{x,target}(f) = q_{x,target}(f) + \langle q_{90,input}(f) - q_{90,target}(f) \rangle$, where $\langle \ldots \rangle$ denotes the averaging operation over all bands, where the average is taken after expressing the quantiles in an energy scale. In each frequency band f, a difference between the $q_{90}$ quantiles between shifted-target and input are computed as:

$$g_{diff}(f) = Q_{90,target}(f) - q_{90,input}(f).$$

Then, static gain generator 302 computes meanGainDdB, the mean of $g_{diff}(f)$ in the bands with good enough SNR score (e.g. SNRscore>0.3). Finally, the static gains are computed as:

$$g_s(f) = \text{meanGainDdB} + \text{SNRscore}(f) \cdot (g_{diff}(f) - \text{meanGainDdB}).$$

In an embodiment, the gains may be smoothed over certain frequency bands, mainly to avoid over-equalization of content that is very sparse in the frequency domain. For example, in a song where the bass plays always the same note, a flat target profile would attempt to reduce that note and boost the surrounding empty bands. This can be mitigated by averaging the gains so that in the low band (e.g. f<150 Hz) they are the average of the nearest neighbors in frequency, in the low-mid band (e. g. 150 Hz<f<250 Hz) they are the average of, e.g., six neighbor gains and in the mid and high range (e. g. f>250 Hz) they are the average of, e.g., eight neighbor gains. To summarize, static gains are applied to all frames except in bands where the SNR is not good, with the intent of adjusting the overall spectral balance of the song to the target.

Figure 4:
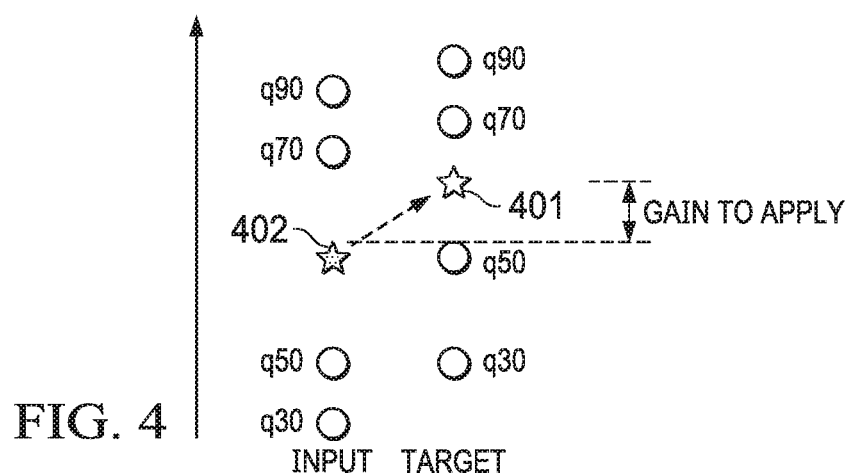
FIG. 4 illustrates computing DynEQ gain in each frequency band of an audio signal, according to an embodiment.

Dynamic gain generator 303 computes the dynamic gains $g_d(f,n)$. At each frame n and band f, the input level $L_{in}(n,f)$ is computed, and its position in the input distribution is computed (star 401 on the left of FIG. 4). The dynamic gain is the amount of gain required to bring the input energy into its corresponding point of the statistical distribution of the target profile (star 402 on the right of FIG. 4). Levels below $q_{10}$ or above $q_{99}$ are clamped to $q_{10}$ and $q_{99}$ respectively. The desired output level $L_{out}(n,f)$ is such that the frame and band being processed would fall in the corresponding position of the output distribution (star 402). The desired dynamic gain $g_d(n,f)$ is computed as:

$$g_d(n,f) = L_{out}(n,f) - L_{in}(n,f) - g_s(f),$$

where $g_s(f)$ is the previously computed static gain for the given band f. This ensures that the resulting distribution of the processed input signal would match the target distribution. In an embodiment, the SNRscore(f) is used to reduce the dynamic gains in the same way as was done for the static gains. For example, after the dynamic gains $g_d(n,f)$ are computed they are multiplied by SNRscore(f):

$$g_d(n,f) = \text{SNRscore}(f) * g_d(n,f).$$

If the input profile has very limited dynamic range (e.g., a constant, steady signal), mapping it to the target profile may result in excessive and unnecessary gain variations over time. To avoid this hyper-expansion, the dynamic range of the input and target profiles ($DR_{in}$, $DR_{target}$) are computed by subtracting their respective $q_{90}$ and $q_{10}$ values, and a maximum desired expansion ratio maxRatio is defined. In the bands where the difference in dynamic range of input and target profiles exceed the max desired expansion ratio ($DR_{in}/DR_{target}$>maxRatio) the dynamic gains $g_d(n,f)$ are set to 0 dB. In the bands where the expansion is between okRatio and maxRatio the gains are multiplied by ($DR_{in}/DR_{target}$−maxRatio)/(okRatio−maxRatio).

In an embodiment, maxRatio and okRatio are constants that are determined empirically. For example, maxRatio=10 corresponds to approximately to 20 dB and okRatio=5 corresponds approximately to 15 dB. If the dynamic range is expanding in a band less than 15 dB, gains are applied. If the dynamic range is expanding by more than 20 dB, gains are not applied. If the dynamic range is between 15 and 20 dB, interpolation is applied between full-gains and zero-gains.

Gain combiner 304 combines the static and dynamic gains. To avoid excessive boost, the gains can be limited (e.g., limited to +10 dB). In an embodiment, the amount of EQ per band can be tuned by the user by specifying dynEQamount and staticEQamount (both between 0.0 and 1.0), where a value of 1.0 preserves the computed gains, 0.0 sets the gains to 0.0 and values in-between reduce the amount of EQ proportionally to the value. The final amount of gain in band f and frame n therefore becomes:

$$g(n,f) = \text{dynEQamount} \cdot g_d(n,f) + \text{staticEQamount} \cdot g_s(f).$$

In an embodiment, the final gains are smoothed over certain frequency bands to avoid potential artifacts due to abrupt variation of gains across frequency.

After the final gains are computed, audio processor 305 applies the gains to the input audio signal. The processing by system 300 described above is based on the analysis of the whole song/track, therefore it applies to off-line workflows, where the whole content has been recorded before being processed.

Figure 3B:
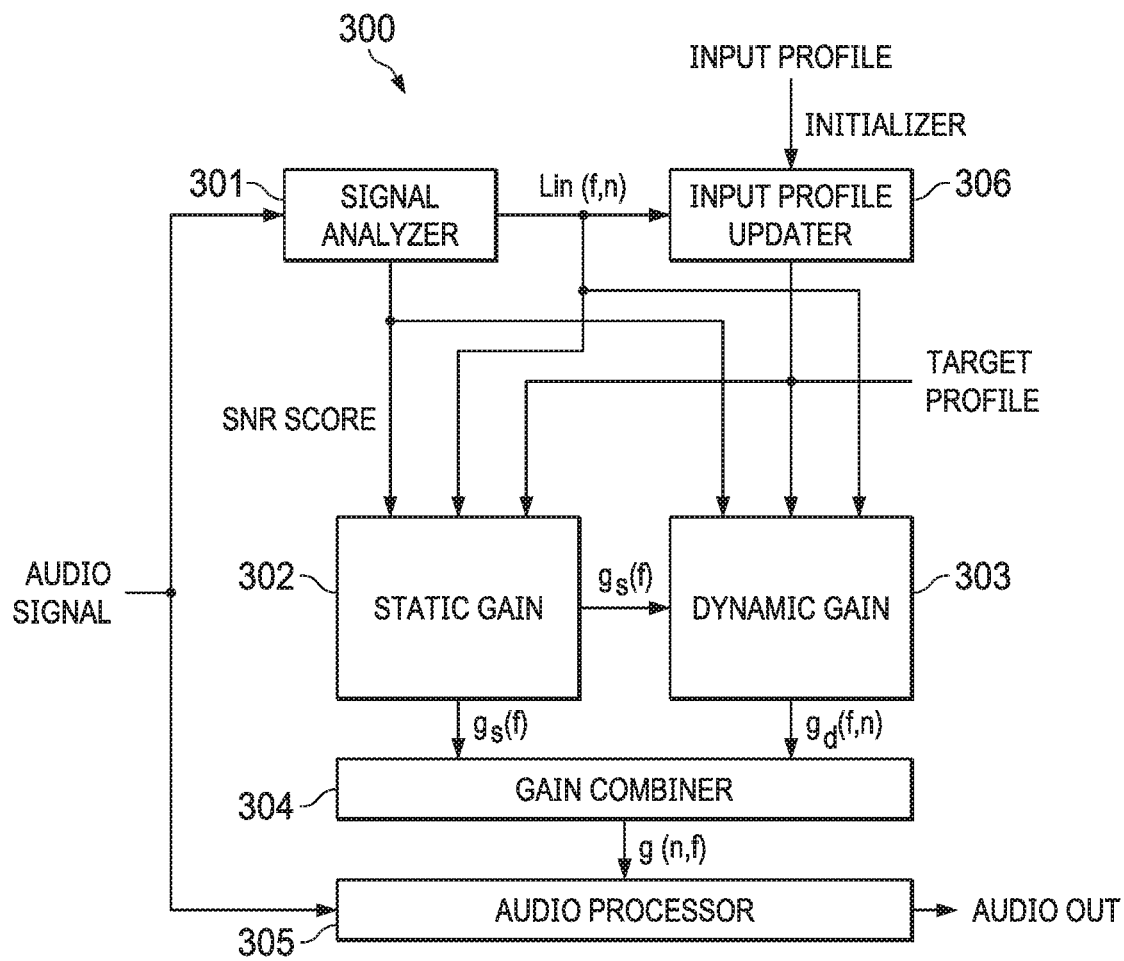
FIG. 3B is block diagram of an audio processing system for applying DynEQ to audio signals in an online workflow, according to an embodiment.

FIG. 3B is block diagram of an audio processing system 300 for applying DynEQ to audio signals in an online workflow, according to an embodiment. In this embodiment, the processing can be adapted to on-line workflows, where the input profile is initialized to a suitable profile and updated by input profile updater 306 while the song/track is playing. The initialized profile can be determined in multiple ways depending on the application. Examples include choosing default profiles for music genres (e.g., rock, acoustic, classical, etc.), for default vocal tracks, or by analyzing an initial, possibly short, sample recording before the song begins, such as a sound check. In such an embodiment, some inaccuracy at the beginning of the performance may result but would converge to the off-line version by the end of the song/track.

C. Further Processing

Figure 5A:
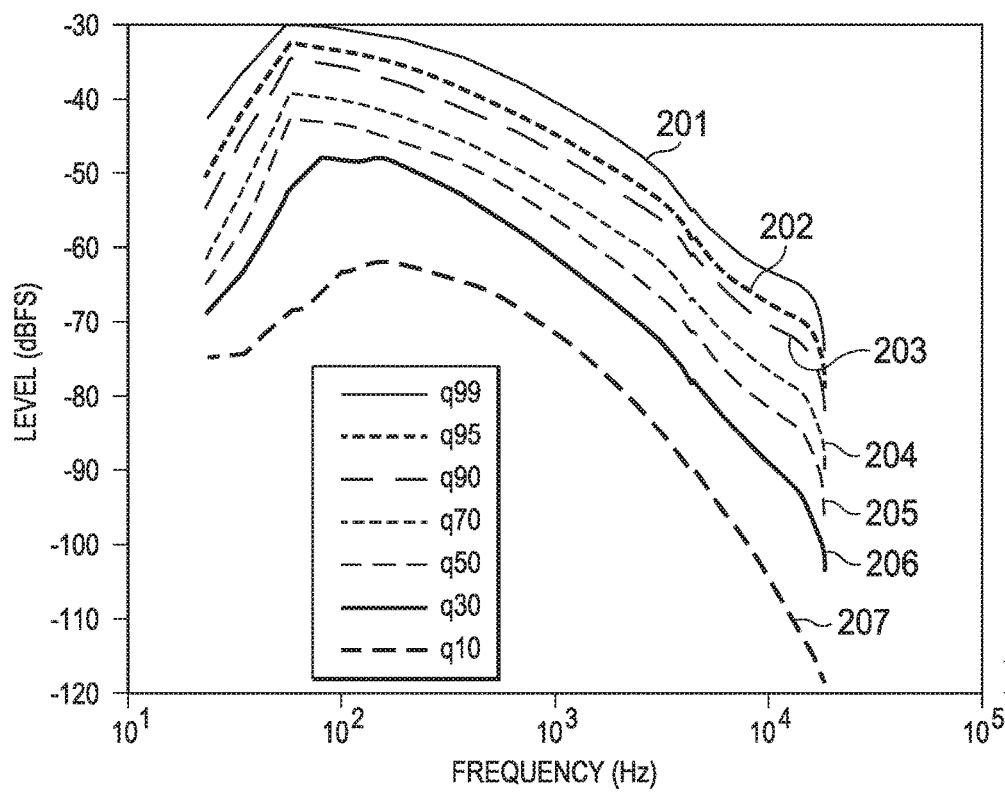
FIGS. 5A and 5B are original and compressed versions, respectively, of a spectral profile, according to an embodiment.
Figure 5B:
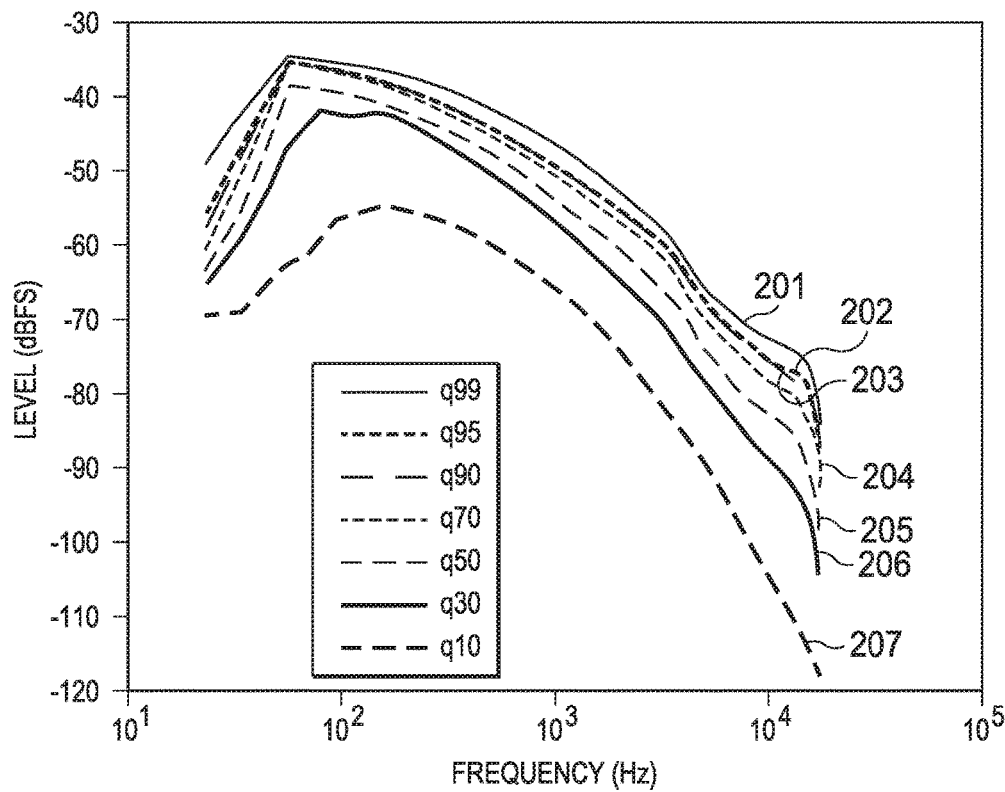

The concept of adjusting the content to a target frequency response and dynamic range, defined by the quantiles of the target profile, naturally allows for meaningful high-level modifications on top of the default results of DynEQ. For example, if a more compressed dynamic range is desired, it is sufficient to pre-process the target quantiles, shifting them vertically so that the spacing between quantiles is reduced. Similarly, for a larger dynamic range it is sufficient to increase the spacing between quantiles. FIG. 5A shows the original target profile previously shown in FIG. 2 and FIG. 5B shows a compressed version of the target profile, showing the quantile curves shifting vertically, reducing the spacing between the quantile curves.

Figure 6:
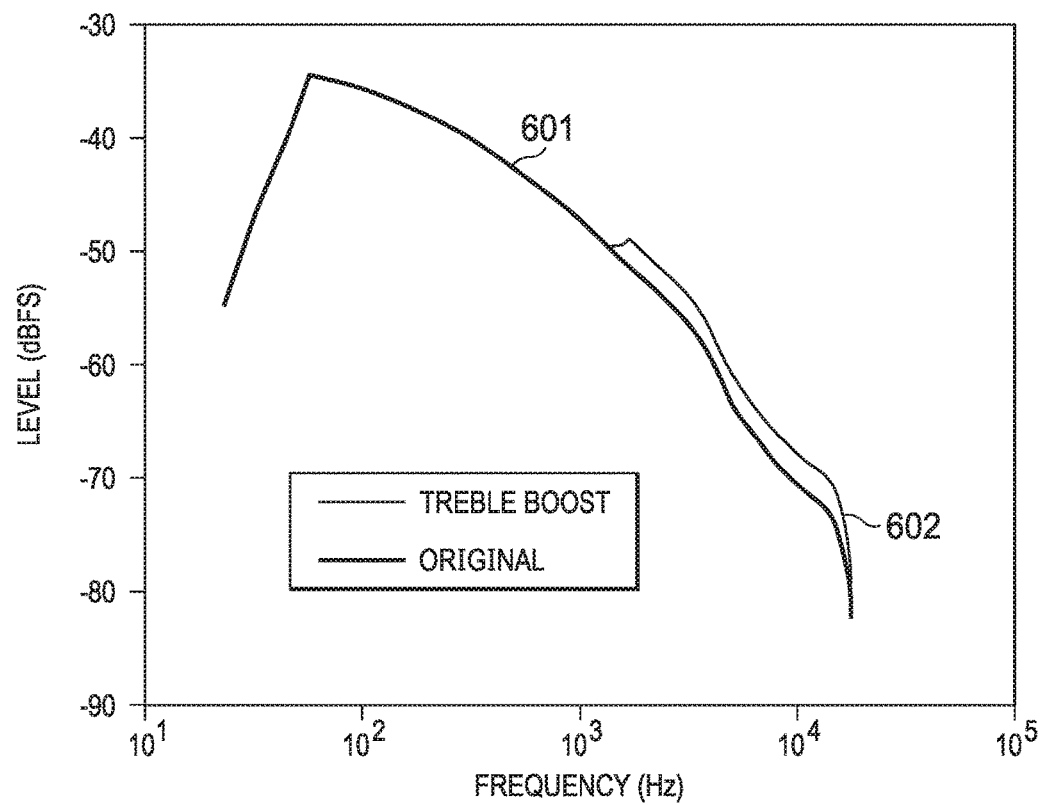
FIG. 6 is a spectral profile modified to boost high frequencies, according to an embodiment.

If a "brighter" sound is desired, it is sufficient to increase the amount of high frequencies in the target profiles. FIG. 6 shows the original target quantile curve 601 and treble boost 602. Adjusting the amount of high or low frequencies allows a user's tweaks to be expressed and captured by preprocessing the target profile to create a modified version. This technique provides predictable and repeatable changes regardless of the target profile selected and the input material that is processed.

Figure 7:
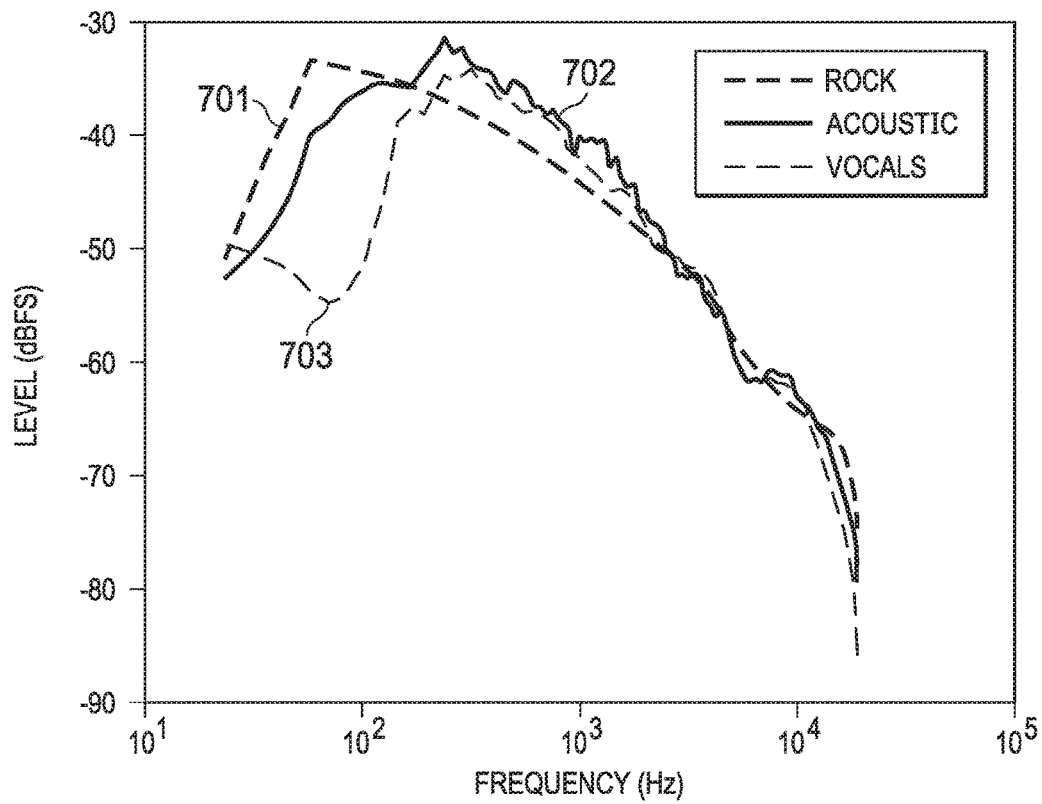
FIG. 7 compares quantile curves of spectral profiles of three different genres of music, according to an embodiment.

In an embodiment, it is desirable to automatically select the most suitable target profile among multiple possibilities. Target quantile curves 701-703 computed from different genres can differ significantly, as shown in FIG. 7. The mismatch of target quantile curves when processing a certain song/track can lead to excessive boost in areas where the song/track has no meaningful signal. As an example, a rock target profile is likely to have a significant amount of bass energy. If an acoustic or vocal-solo performance is processed to match such a target profile, it may result in an unnecessary amount of EQ at low frequencies. To avoid such mismatch, an automatic selection of the most suitable target profile can be done. In an embodiment, a target profile is selected that minimizes the mean-square error between the $q_{90}$ of the target and the $q_{90}$ of the song/track, in a certain frequency region, e.g., for 60 Hz<f<500 Hz.

The processing described so far has been presented in the context of music mastering, where corrections are made on a single file, which is usually the mix of several sources (instruments, tracks, etc.). DynEQ, however, can also be applied to each (or some) of the individual tracks that contribute to the mix. The process would remain unchanged, but specific target profiles can be defined for each track (e.g., by creating a target profile for each of the instruments or sources in the song). This embodiment provides the following advantages: 1) more control in an automated mixing process; 2) an optimized EQ/DRC for each instrument; 3) the opportunity for the users to apply high-level tweaks independently to each instrument (e.g. to obtain brighter, more compressed drums); and 4) the opportunity of mapping a single high-level user tweak into focused specific tweaks to each instrument. For example, choosing a "60's Rock n' Roll" style would not only apply EQ and DRC to the final mix, but also actually treat each single instrument in the most appropriate way for the genre, resulting in a closer match to the desired style.

Figure 8:
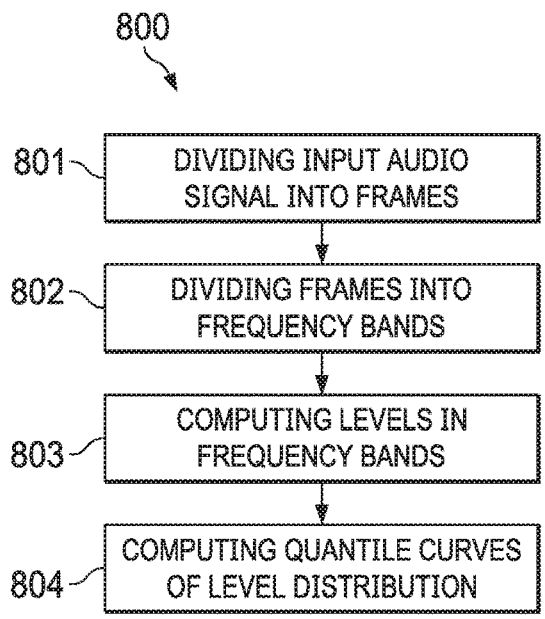
FIG. 8 is a flow diagram of a process for building spectral profiles of audio signals, according to an embodiment.

FIG. 8 is a flow diagram of process 800 for building spectral profiles of audio signals, according to an embodiment. Process 800 can be implemented by the audio processing unit of FIG. 10.

Process 800 can begin by dividing an input audio signal into n frames (801). For example, an audio signal s(t) can be divided into frames of length frameLength samples (e.g., 4096 samples) with nOverlap samples (e.g., 2048 samples) of overlap between consecutive frames. In an embodiment, a window function (e.g., a Hanning window) is applied to the frames to ensure smooth interpolation between consecutive frames.

Process 800 continues by dividing each frame n of the input audio signal into Nb frequency bands f (802). For example, a filterbank can divide the windowed signal s(t) into Nb frequency bands (e.g., 83 bands or sub-bands).

Process 800 continues by computing an input level of the input audio signal in each band f of frame n (803). For example, a level detector can compute the level $L_{in}(n,f)$ of the input audio signal in each band f of each frame n. In an embodiment, the level is the energy E(n, converted to dB. In an embodiment, the level is an amplitude or loudness.

Process 800 continues by computing a plurality of quantile curves of an input level distribution in band f (804). For example, in each band f the x-th quantile $g_x(f)$ of the input level distribution is computed as the value below which x % of the levels across frames in the band are contained. If the signal is multichannel, the level in each band at a given frame is derived from the levels of the individual channels, such as by using the root-mean-square (RMS) average of energies across channels or maximum energy across channels.

Figure 9:
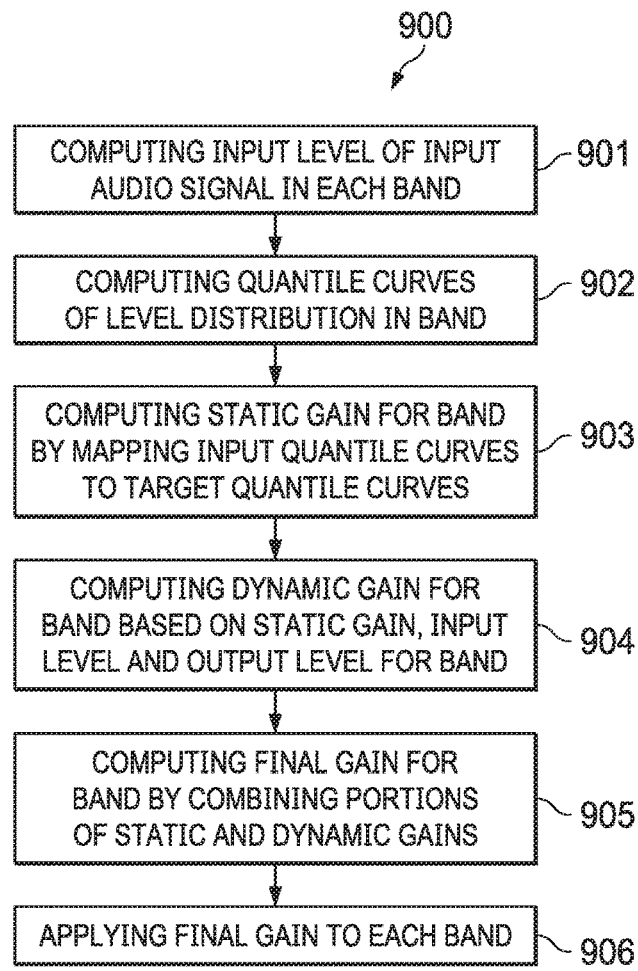
FIG. 9 is a flow diagram of a DynEQ process, according to an embodiment

FIG. 9 is a flow diagram of DynEQ process 900, according to an embodiment. Process 900 can be implemented by the audio processing unit of FIG. 10. For each frame n, process 900 computes an input level of the input audio signal in each band f (901), and then computes an input audio level distribution in each band f that includes a plurality of input quantile curves (902). Process 900 continues by computing a static gain for each band f based at least in part on a mapping of input quantile curves of the input audio level distribution to a reference audio level distribution including target quantile curves computed from one or more reference audio signals (903), as described in reference to FIG. 3. In an embodiment, the mapping is based on matching one or more statistical moments of the input audio level distribution to moments of the target level distribution, such as matching means or standard deviations, possibly augmented with higher-order moments, etc.

Process 900 continues by computing dynamic gain for each band f based at least in part on the static gain, the input level and a specified output level for the band f (904), as described in reference to FIG. 3. Process 900 continues by computing a final gain for each band f by combining a portion of the static gain and a portion of the dynamic gain (905) and applying the final gain to each band f of the input audio signal (906), as described in reference to FIG. 3.

After the final gain has been applied to each band f, the audio signal can be reconstructed by transforming back to time domain and using an overlap and add technique or any other technique known to those with skill in the audio arts. The reconstructed audio signal can then be streamed or played back on an audio playback device (e.g., through loudspeakers or headphones/earbuds of a stereo or multichannel audio system or media player application installed on a mobile device).

Example System Architecture

Figure 10:
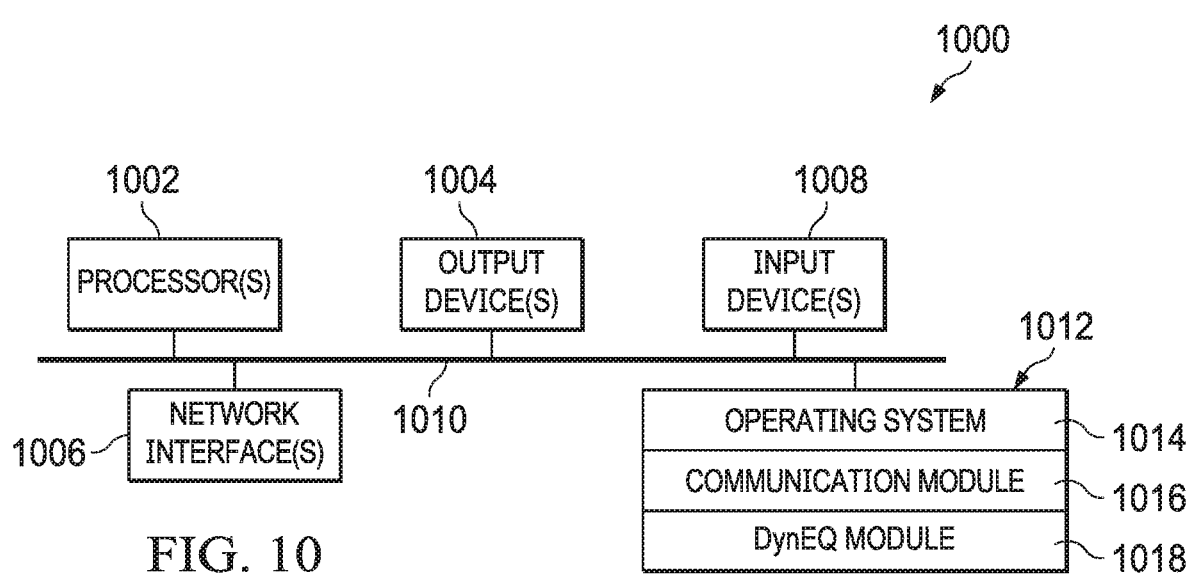
FIG. 10 is a block diagram of an audio processing unit for performing the processes described in reference to FIGS. 1-9.

FIG. 10 is a block diagram of an audio processing unit 1000 for performing the processes described in reference to FIGS. 1-9. Other architectures are possible, including architectures with more or fewer components. In some implementations, audio processing unit 1000 includes one or more processors 1002 (e.g., dual-core Intel® Xeon® Processors, digital signal processors), one or more output devices 1004 (e.g., LCD), one or more network interfaces 1006 (e.g., physical ports, wireless transceiver), one or more input devices 1008 (e.g., mouse, keyboard, touch-sensitive display) and one or more computer-readable mediums 1012 (e.g., RAM, ROM, SDRAM, hard disk, optical disk, flash memory, etc.). These components can exchange communications and data over communication channels 1010 (e.g., buses), which can utilize various hardware and software for facilitating the transfer of data and control signals between components. The term "computer-readable medium" refers to a medium that participates in providing instructions to processor 1002 for execution, including without limitation, non-volatile media (e.g., optical or magnetic disks), volatile media (e.g., memory) and transmission media. Transmission media includes, without limitation, coaxial cables, copper wire and fiber optics.

Computer-readable medium 1012 can further include operating system instructions 1014 (e.g., a Linux® operating system), communication module 1016 and DynEQ module 1018. Operating system 1014 can be multi-user, multiprocessing, multitasking, multithreading, real time, etc. Operating system 1014 performs basic tasks, including but not limited to: recognizing input from and providing output to network interfaces 1006 and/or devices 1008; keeping track and managing files and directories on computer-readable mediums 1012 (e.g., memory or a storage device); controlling peripheral devices; and managing traffic on the one or more communication channels 1010. Communication module 1016 includes a software stack (e.g., TCP/IP stack) for communicating with other devices and server computers over a network (e.g., the Internet). DynEQ module 1018 includes computer instructions that, when executed, cause processor 1002 to perform the processes described in reference to FIGS. 1-9.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random-access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor or a retina display device for displaying information to the user. The computer can have a touch surface input device (e.g., a touch screen) or a keyboard and a pointing device such as a mouse or a trackball by which the user can provide input to the computer. The computer can have a voice input device for receiving voice commands from the user.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of implementations of the invention have been described. Nevertheless, it will be understood that various modifications can be made without departing from the spirit and scope of the invention.

Various aspects of the present invention may be appreciated from the following enumerated example embodiments (EEEs):

1. A method comprising:
  dividing, by an audio processing unit, an input audio signal into n frames, where n is a positive integer greater than one;
  dividing, by the audio processing unit, each frame of the input audio signal into Nb frequency bands, where Nb is a positive integer greater than one;
  for each frame n:
    computing, by the audio processing unit, an input level of the input audio signal in each band f, resulting in an input audio level distribution for the input audio signal;
    computing, by the audio processing unit, a gain for each band f based at least in part on a mapping of one or more properties of the input audio level distribution to a reference audio level distribution; and
    applying, by the audio processing unit, each computed gain for each band f to each corresponding band f of the input audio signal.

2. The method of EEE 1, further comprising:
  in each frame n and after applying the computed gains, reconstructing the input audio signal back to the time domain.

3. The method of EEE 1, wherein the gain for each band f is computed by first computing a static gain, and then a dynamic gain for each band f based on the static gain, the input level, the input audio level distribution and the reference audio level distribution, and then computing a final gain for each band f by combining a portion of the static gain and a portion of the dynamic gain.

4. The method of EEE 3, further comprising:
  in each frame n, applying the final gain to the input audio signal and then reconstructing the input audio signal back to the time domain.

5. The method of EEE 3, further comprising:
  smoothing at least one of the static gains, the dynamic gains or the final gains over frequency bands.

6. The method of EEE 1, wherein the mapping of the input audio level distribution to the reference audio level distribution is based on matching input quantile curves of the input audio level distribution to target quantile curves of the reference audio level distribution.

7. The method of EEE 6 further comprising:
  in each frame n, updating, by the audio processing unit, the input quantile curves of a distribution of the input level in each band f.

8. The method of EEE 6 or 7, wherein for each band f, an x-th input quantile curve is computed as a value below which x % of the input levels across Nb frames in the band f are contained.

9. The method of EEE 6 or 7, wherein the target quantile curves are determined after averaging over the one or more reference audio signals that share a given feature.

10. The method of EEE 1, wherein the mapping of the input audio level distribution to the reference audio level distribution is based on matching one or more moments of the input audio level distribution to moments of the reference audio level distribution.

11. The method of EEE 1, applying a window function to each frame n after dividing the input audio signal into frames.

12. The method of EEE 1, wherein the computed input level of the input audio signal is one of an energy, amplitude, decibel, or loudness level.

13. The method of EEE 12, further comprising:
  smoothing the computed energy, amplitude, decibel or loudness level in each band f of each frame n based on whether the computed energy, amplitude or loudness level is larger or smaller than an energy, amplitude or loudness level in previous frames.

14. The method of EEE 1, wherein the input audio signal is a multichannel audio signal and the input level of the input audio signal in each band f is determined from the energies of each channel.

15. The method of EEE 14, wherein the input audio level is computed by using a root-mean-square average or selecting a maximum energy.

16. The method of EEE 1, wherein the reference audio level distribution is computed over one or more reference audio signals within a same music genre.

17. The method of EEE 1, wherein the reference audio level distribution is computed over one or more reference audio signals that include at least one of dialog, effects or music.

18. The method of EEE 1, wherein the reference audio level distribution is computed over one or more reference audio signals within the same type of instrument or instrument track.

19. The method of EEE 2, wherein computing a static gain based at least in part on the mapping of the input quantile curve to the target quantile curve further comprises:
  determining a background noise spectral profile for the input audio signal;
  estimating a signal-to-noise ratio (SNR) for each time-frequency tile of the input audio signal;
  computing an SNR score for each band f, the SNR score representing a difference between the input quantile curve and a noise quantile curve;
  computing a difference between an x-th input quantile curve and a corresponding x-th target quantile curve using the formula:

$$g_{diff}(f) = Q_{x,target}(f) - q_{x,input}(f);$$

computing a mean static gain for each band f that has an SNR score greater than a specified threshold value; and
  computing the static gain for each band f using the formula:

$$g_s(f) = \text{meanGainDdB} + \text{SNRscore}(f) \cdot (g_{diff}(f) - \text{meanGainDdB}),$$

where meanGainDdB is the mean static gain, SNRscore(f) is the SNR score for band f and $g_{diff}(f)$ is the difference between the x-th input quantile curve and the corresponding x-th target quantile curve for band f.

20. The method of EEE 19, wherein the static gains are smoothed over one or more frequency bands.

21. The method of EEE 19, wherein the dynamic gain is computed using the formula:

$$g_d(n,f) = \text{SNRscore}(f) * (L_{out}(n,f) - L_{in}(n,f) - g_s(f)),$$

where $g_s(f)$ is the static gain for band f, $L_{out}(n,f)$ is the specified output level for band f of frame n and $L_{in}(n,f)$ is the input level for band f of frame n.

22. The method of EEE 21, further comprising:
  determining a first dynamic range in each band f of the input quantile curve;
  determining a second dynamic range in each band f of the target quantile curve;

computing an expansion ratio as the ratio of the first and second dynamic ranges;

defining a maximum desired expansion ratio; and setting the dynamic gain to zero for bands where the expansion ratio exceeds the maximum desired expansion ratio.

23. The method of EEE 19, wherein the final gain for each band f of frame n comprises:

$$g(n,f)=\text{dynEQamount}\cdot g_d(n,f)+\text{staticEQamount}\cdot g_s(f),$$

wherein dynEQamount and staticEQamount are real numbers between 0.0 and 1.0 determine the contributions of dynamic gain $g_d(n,f)$ and static gain $g_s(f)$ to the final gain $g(n,f)$, respectively.

24. The method of EEE 6, further comprising:

processing the target quantile curves to increase or reduce spacing between the target quantile curves based on a desired dynamic range.

25. The method of EEE 6, further comprising:

modifying the target quantile curves based on a desired frequency spectrum.

26. The method of EEE 1, further comprising:

selecting the target quantile curves that minimize a mean-square-error between an x-th target quantile curve and a corresponding x-th input quantile curve in a specified frequency region.

27. An audio processing unit comprising one or more processors and memory storing instructions that when executed by the one or more processors, cause the one or more processors to perform the methods recited in any one of the preceding EEEs 1-26.

28. A non-transitory, computer-readable storage medium storing instructions that when executed by one or more processors, cause the one or more processors to perform the methods recited in any one of the preceding EEEs 1-26.

The invention claimed is:

1. A method comprising:

dividing, by an audio processing unit, an input audio signal into n frames, where n is a positive integer greater than one;

dividing, by the audio processing unit, each frame of the input audio signal into Nb frequency bands, where Nb is a positive integer greater than one;

for each frame n:

computing, by the audio processing unit, an input level of the input audio signal in each band f resulting in a spectral profile representing an input audio level distribution for the input audio signal;

computing, by the audio processing unit, a gain for each band f based at least in part on a mapping of one or more properties of the input audio level distribution to a target spectral profile representing a reference audio level distribution;

applying, by the audio processing unit, each computed gain for each band f to each corresponding band f of the input audio signal, to form a modified input audio signal; and reconstructing the modified input audio signal back to the time domain.

2. The method according to claim 1, further comprising selecting the target spectral profile from a set of pre-stored target spectral profiles.

3. The method of claim 1, wherein the gain for each band f is computed by first computing a static gain, and then a dynamic gain for each band f based on the static gain, the input level, the input audio level distribution and the reference audio level distribution, and then computing a final gain for each band f by combining a portion of the static gain and a portion of the dynamic gain.

4. The method of claim 3, further comprising:

smoothing at least one of the static gains, the dynamic gains or the final gains over frequency bands.

5. The method of claim 1, wherein the mapping of the input audio level distribution to the reference audio level distribution is based on matching input quantile curves of the input audio level distribution to target quantile curves of the reference audio level distribution.

6. The method of claim 5, wherein for each band f, an x-th input quantile curve is computed as a value below which x % of the input levels across Nb frames in the band f are contained.

7. The method of claim 5, wherein the target quantile curves are determined after averaging over the one or more reference audio signals that share a given feature.

8. The method of claim 1, wherein the computed input level of the input audio signal is one of an energy, amplitude, decibel, or loudness level.

9. The method of claim 8, further comprising:

smoothing the computed energy, amplitude, decibel or loudness level in each band f of each frame n based on whether the computed energy, amplitude or loudness level is larger or smaller than an energy, amplitude or loudness level in previous frames.

10. The method of claim 1, wherein computing a static gain based at least in part on the mapping of the input quantile curve to the target quantile curve further comprises:

determining a background noise spectral profile for the input audio signal;

estimating a signal-to-noise ratio (SNR) for each time-frequency tile of the input audio signal;

computing an SNR score for each band f the SNR score representing a difference between the input quantile curve and a noise quantile curve;

computing a difference between an x-th input quantile curve and a corresponding x-th target quantile curve using the formula:

$$g_{diff}(f)=Q_{x,target}(f)-q_{x,input}(f)$$

computing a mean static gain for each band f that has an SNR score greater than a specified threshold value; and computing the static gain for each band f using the formula:

$$g_s(f)=\text{meanGainDdB}+\text{SNRscore}(f)\cdot(g_{diff}(f)-\text{meanGainDdB}),$$

where meanGainDdB is the mean static gain, SNRscore(f) is the SNR score for band f and $g_{diff}(f)$ is the difference between the x-th input quantile curve and the corresponding x-th target quantile curve for band f.

11. The method of claim 10, wherein the dynamic gain is computed using the formula:

$$g_d(n,f)=\text{SNRscore}(f)*(L_{out}(n,f)-L_{in}(n,f)-g_s(f)),$$

where $g_s(f)$ is the static gain for band f, $L_{out}(n,f)$ is the specified output level for band f of frame n and $L_{in}(n,f)$ is the input level for band f of frame n.

12. The method of claim 11, further comprising:

determining a first dynamic range in each band f of the input quantile curve;

determining a second dynamic range in each band f of the target quantile curve;

computing an expansion ratio as the ratio of the first and second dynamic ranges;

defining a maximum desired expansion ratio; and setting the dynamic gain to zero for bands where the expansion ratio exceeds the maximum desired expansion ratio.

13. The method of claim 10, wherein the final gain for each band f of frame n comprises:

$$g(n,f) = \text{dynEQamount} \cdot g_d(n,f) + \text{staticEQamount} \cdot g_s(f),$$

wherein dynEQamount and staticEQamount are real numbers between 0.0 and 1.0 determine the contributions of dynamic gain $g_d(n,f)$ and static gain $g_s(f)$ to the final gain $g(n,f)$, respectively.

14. The method of claim 1, further comprising:
processing the target quantile curves to increase or reduce spacing between the target quantile curves based on a desired dynamic range.

15. The method of claim 1, further comprising: modifying the target quantile curves based on a desired frequency spectrum.

16. The method of claim 1, wherein the mapping of the input audio level distribution to the reference audio level distribution is based on matching one or more moments of the input audio level distribution to moments of the reference audio level distribution.

17. The method of claim 1, wherein the input audio signal is a multichannel audio signal and the input level of the input audio signal in each band f is determined from the energies of each channel.

18. The method of claim 1, further comprising:
selecting the target quantile curves that minimize a mean-square-error between an x-th target quantile curve and a corresponding x-th input quantile curve in a specified frequency region.

19. An audio processing unit comprising one or more processors and memory storing instructions that when executed by the one or more processors, cause the one or more processors to perform the method recited in claim 1.

20. A non-transitory, computer-readable storage medium storing instructions that when executed by one or more processors, cause the one or more processors to perform the method recited in claim 1.

* * * * *

UNITED STATES PATENT AND TRADEMARK OFFICE
CERTIFICATE OF CORRECTION

PATENT NO. : 11,430,463 B2
APPLICATION NO. : 17/259787
DATED : August 30, 2022
INVENTOR(S) : Cengarle et al.

It is certified that error appears in the above-identified patent and that said Letters Patent is hereby corrected as shown below:

On the Title Page

Column 2, Item (57) Abstract:
Line 4, delete "n frames" and insert --$n$ frames--.
Line 4, delete "where n" and insert --where $n$--.
Line 6, delete "Nb frequency" and insert --$Nb$ frequency--.
Line 6, delete "where Nb" and insert --where $Nb$--.

Page 2, Column 1, Item (57) Abstract:
Line 1, delete "frame n:" and insert --frame $n$:--.
Line 2, delete "band f," and insert --band $f$,--.
Line 4, delete "band f" and insert --band $f$--.
Line 6, after "reference", delete "N".
Line 8, delete "band f to" and insert --band $f$ to--.
Line 8, delete "band f of" and insert --band $f$ of--.

In the Claims

Column 13, Claim 1:
Line 39, delete "into n" and insert --into $n$--.
Line 39, delete "where n" and insert --where $n$--.
Line 42, delete "into Nb" and insert --into $Nb$--.
Line 42, delete "where Nb" and insert --where $Nb$--.
Line 44, delete "n:" and insert --$n$:--.
Line 46, delete "band f" and insert --band $f$,--.
Line 50, delete "band f" and insert --band $f$--.
Line 55, delete "band f to" and insert --band $f$ to--.
Line 55, delete "band f of" and insert --band $f$ of--.

Signed and Sealed this
First Day of October, 2024

Katherine Kelly Vidal
*Director of the United States Patent and Trademark Office*

CERTIFICATE OF CORRECTION (continued)
U.S. Pat. No. 11,430,463 B2

Column 13, Claim 3:
Line 64, delete "f is computed" and insert --$f$ is computed--.
Line 65, delete "band f" and insert --band $f$--.

Column 14, Claim 3:
Line 1, delete "band f" and insert --band $f$--.

Column 14, Claim 6:
Line 11, delete "band f," and insert --band $f$,--.
Line 11, delete "x-th" and insert --$x$-th--.
Lines 12-13, delete "x%" and insert --$x$%--.
Line 13, delete "Nb frames" and insert --$Nb$ frames--.
Line 13, delete "band f" and insert --band $f$--.

Column 14, Claim 9:
Line 23, delete "band f" and insert --band $f$--.
Line 23, delete "frame n" and insert --frame $n$--.

Column 14, Claim 10:
Line 34, delete "band f" and insert --band $f$,--.
Line 37, delete "x-th" and insert --$x$-th--.
Line 38, delete "x-th" and insert --$x$-th--.
Line 42, delete "band f" and insert --band $f$--.
Line 44, delete "band f" and insert --band $f$--.
Line 49, delete "meanGainDdB" and insert --$meanGainDdB$--.
Line 49, delete "SNRscore(f)" and insert --$SNRscore(f)$--.
Line 50, delete "band f" and insert --band $f$--.
Line 50, delete "g$_{diff}$(f)" and insert --$g_{diff}(f)$--.
Line 51, delete "x-th" and insert --$x$-th--.
Line 52, delete "x-th" and insert --$x$-th--.
Line 52, delete "band f." and insert --band $f$.--.
Line 57, delete "g$_s$(f)" and insert --$g_s(f)$--.
Line 57, delete "band f," and insert --band $f$,--.
Line 57, delete "L$_{out}$(n,f)" and insert --$L_{out}(n,f)$--.

Column 14, Claim 11:
Line 58, delete "band f" and insert --band $f$--.
Line 58, delete "frame n" and insert --frame $n$--.
Line 58, delete "L$_{in}$(n,f)" and insert --$L_{in}(n,f)$--.
Line 59, delete "band f" and insert --band $f$--.
Line 59, delete "frame n." and insert --frame $n$.--.

Column 14, Claim 12:
Line 61, delete "band f" and insert --band $f$--.
Line 63, delete "band f" and insert --band $f$--.

Column 15, Claim 13:
Line 5, delete "band f" and insert --band *f*--.
Line 5, delete "frame n" and insert --frame *n*--.
Line 9, delete "dynEQamount and staticEQamount" and insert --*dynEQamount and staticEQamount*--.
Line 11, delete "$g_d$(n,f)" and insert --$g_d(n,f)$--.
Line 11, delete "$g_s$(f)" and insert --$g_s(f)$--.
Line 12, delete "g(n,f)," and insert --$g(n,f)$,--.

Column 15, Claim 15:
Line 17, after "comprising:", insert --¶--.

Column 16, Claim 17:
Line 6, delete "band f" and insert --band *f*--.

Column 16, Claim 18:
Line 10, delete "x-th" and insert --*x*-th--.
Line 11, delete "x-th" and insert --*x*-th--.